(12) United States Patent
Maruyama

(10) Patent No.: US 6,771,559 B2
(45) Date of Patent: Aug. 3, 2004

(54) NON-VOLATILE SEMICONDUCTOR INTEGRATED CIRCUIT

(75) Inventor: Akira Maruyama, Suwa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 10/216,559

(22) Filed: Aug. 9, 2002

(65) Prior Publication Data

US 2003/0031065 A1 Feb. 13, 2003

(30) Foreign Application Priority Data

Aug. 10, 2001 (JP) ........................................ 2001-244855

(51) Int. Cl.$^7$ ................................................ G11C 8/00

(52) U.S. Cl. ................................. 365/236; 365/185.12

(58) Field of Search ........................... 365/185.12, 233, 365/235, 236, 238.5

(56) References Cited

U.S. PATENT DOCUMENTS 6,201,756 B1 * 3/2001 Lee ........................ 365/230.04

* cited by examiner

Primary Examiner—Tan T. Nguyen
(74) Attorney, Agent, or Firm—Harness, Dickey & Pierce, P.L.C.

(57) ABSTRACT

A non-volatile semiconductor integrated circuit is provided including a counter circuit that generates column addresses in synchronism with an external clock, and conducts a page programming sequence in word line units, wherein, when inputting program data, the program data is taken in synchronism with fallings and risings of the external clock. That is, program data is taken in synchronism with the risings and fallings of an XWE signal, such that the time for taking program data can be shortened by half. Also, the counter circuit that counts the external clock is driven by using a power supply voltage that is higher than the internal power supply voltage, such that operation delays in the counter circuit are reduced, the frequency of the external clock can be increased and thus the time for taking program data can be further shortened.

7 Claims, 2 Drawing Sheets

NON-VOLATILE SEMICONDUCTOR INTEGRATED CIRCUIT

BACKGROUND OF THE INVENTION

1. Technical Field of the Invention

The present invention relates to a method for taking program data for a non-volatile semiconductor device that conducts a page programming in word line units, such as a NAND type flash memory.

2. Conventional Technology

FIG. 4 shows a circuit diagram of a non-volatile semiconductor integrated circuit in accordance with a conventional example. FIG. 5 shows an output waveform diagram of a counter circuit of the non-volatile semiconductor integrated circuit in accordance with the conventional example. Further, FIG. 6 shows a timing chart for taking program data in the non-volatile semiconductor integrated circuit in accordance with the conventional example. A counter circuit 1 shown in FIG. 4 is formed from flip-flop circuits 2–10. Also, reference numeral 11 denotes a column decoder. The flip-flop circuits 2–10 are connected to an internal power supply VDD and a GND power supply.

Generally, in a NAND type flash memory, a programming operation is conducted for all memory transistors together that are connected to selected word lines. In other words, a page programming is conducted in word line units. At present, the size of a page is usually 512 bytes. Accordingly, the column decoder 11 receives column address signals A0–A8 from the counter circuit 1, and conducts column address selections for 512 addresses. Program data is input and retained in each of the selected column addresses.

An operation of the above is described. As shown in FIG. 6, first, a program mode is set at a rising of a write enable signal XWE to the H level while an address latch enable signal ALE is at the L level. Next, a row address is set (to select a word line) at a rising of the write enable signal XWE to the H level while the ALE signal is at the H level. Next, while the ALE signal is at the L level, program data are successively taken in at each rising of the XWE signal to the H level for one page, in other words, from address 0 to address 511. Then, actual programming operations are executed on the memory transistors. The column address signals A0–A8 are generated by the counter circuit 1 using an input of the XWE signal as shown in FIG. 4, and counted in synchronism with the fallings of the XWE signal. The outputs of the counter circuit 1 in FIG. 4 are calculated such that, as shown in FIG. 5, at the first rising of the XWE signal to the H level, all of the signals A0–A8 are at the L level to select column address 0; at the second rising, only the signal A0 is at the H level to select column address 1; and at the $511^{th}$ rising, all of the signals A0–A8 are at the H level to select column address 511

The conventional technology described above has a problem in that taking program data for one page takes a long time because one data is taken in at each one cycle of the XWE signal. For example, when one cycle is 50 ns, it takes as long as 25.6 µs, which amounts to a substantial proportion against the overall programming time including the actual programming operation time, and therefore is problematical because this makes it difficult to achieve a shorter overall programming time. Also, since outputs of the counter circuit are provided by flip-flop circuits that are connected in multiple stages, there are substantial delays in the outputs, which present a major obstacle to increasing the frequency of the XWE signal in an effort to shorten the time for taking program data.

The present invention is provided to solve such problems, and one object is to shorten the time for taking program data, and shorten the overall programming time.

SUMMARY OF THE INVENTION

A non-volatile semiconductor integrated circuit in accordance with the present invention comprises a counter circuit that generates column addresses in synchronism with an external clock, and conducting a page programming sequence in word line units, wherein, when inputting program data, the program data is taken in synchronism with the fallings and risings of the external clock.

Also, a second non-volatile semiconductor integrated circuit in accordance with the present invention is characterized in that, in the first non-volatile semiconductor integrated circuit, the counter circuit that generates column addresses in synchronism with an external clock is driven based on a power supply voltage that is higher than an internal power supply voltage.

Also, a third non-volatile semiconductor integrated circuit in accordance with the present invention is characterized in that, in the second non-volatile semiconductor integrated circuit, the power supply voltage that is higher than the internal power supply voltage is provided by a step-up power supply that is formed based on the internal power supply voltage or an external power supply voltage.

Also, the third non-volatile semiconductor integrated circuit in accordance with the present invention is characterized in that, in the second non-volatile semiconductor integrated circuit, the power supply voltage that is higher than the internal power supply voltage is supplied by an external power supply voltage.

By the means described above, program data is taken in synchronism with the risings and fallings of an external clock, such that the time for taking program data can be shortened by half.

Also, the counter circuit that counts the external clock is driven by using a power supply voltage that is higher than the internal power supply voltage, such that operation delays in the counter circuit are reduced, the frequency of the external clock can be increased and thus the time for taking program data can be further shortened.

DETAILED DESCRIPTION OF THE PREFERRED EMBODIMENTS OF THE PRESENT INVENTION

Figure 1:
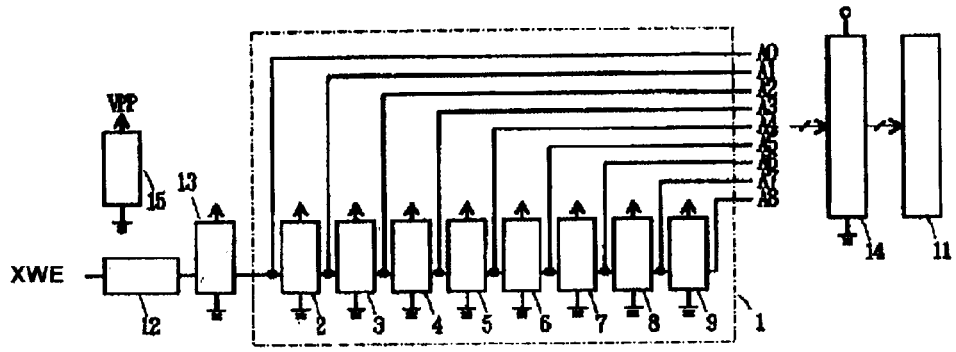
FIG. 1 shows a non-volatile semiconductor integrated circuit in accordance with an embodiment of the present invention.
Figure 2:
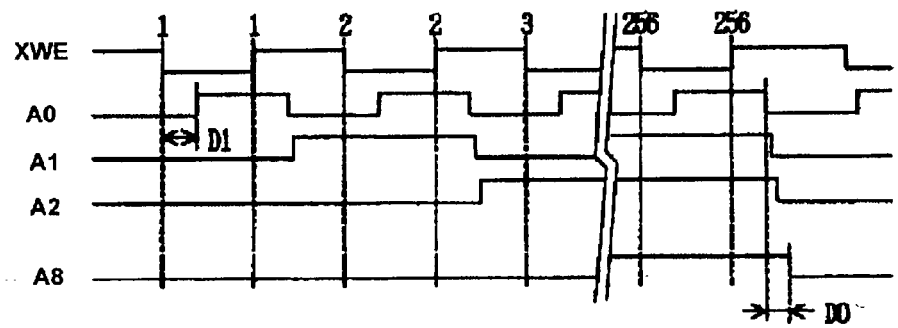
FIG. 2 shows an output waveform diagram of a counter circuit of the non-volatile semiconductor integrated circuit in accordance with an embodiment of the present invention.
Figure 3:
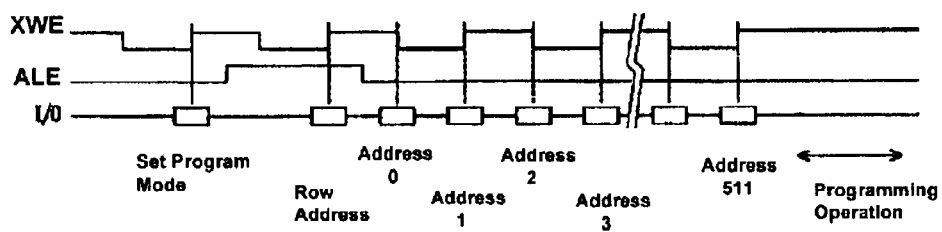
FIG. 3 shows a timing chart for taking program data in the non-volatile semiconductor integrated circuit in accordance with an embodiment of the present invention.
Figure 4:
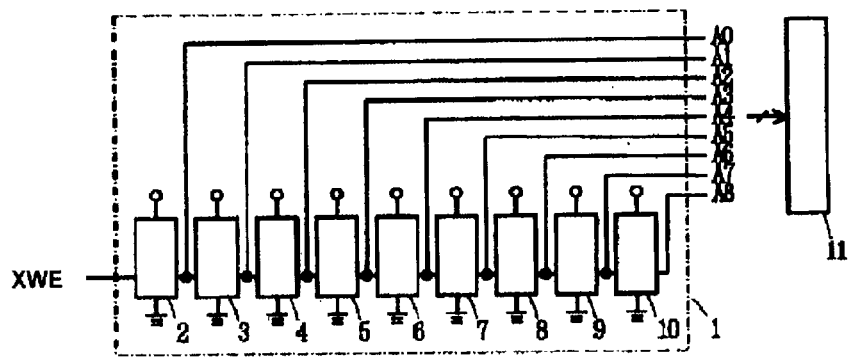
FIG. 4 shows a circuit diagram of a non-volatile semiconductor integrated circuit in accordance with a conventional example.
Figure 5:
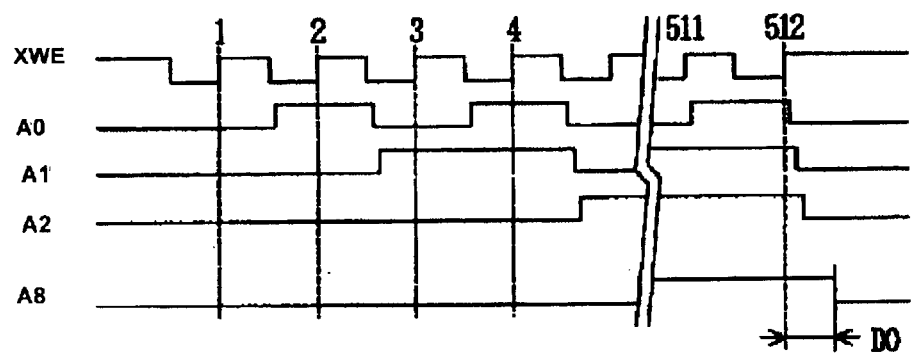
FIG. 5 shows an output waveform diagram of a counter circuit of a non-volatile semiconductor integrated circuit in accordance with the conventional example.
Figure 6:
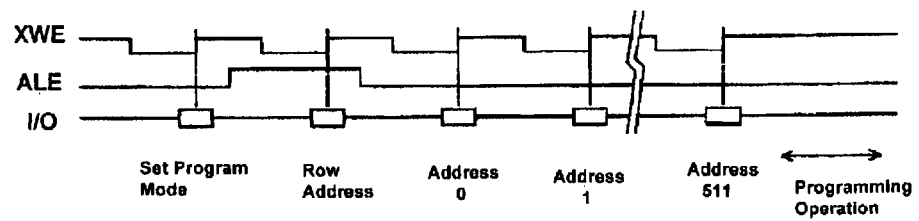
FIG. 6 shows a timing chart for taking program data in a non-volatile semiconductor integrated circuit in accordance with the conventional example.

FIG. 1 shows a non-volatile semiconductor integrated circuit in accordance with an embodiment of the present invention. FIG. 2 shows an output waveform diagram of a counter circuit of the non-volatile semiconductor integrated circuit in accordance with an embodiment of the present invention. Further, FIG. 3 shows a timing chart for taking program data in the non-volatile semiconductor integrated circuit in accordance with an embodiment of the present invention. A counter circuit 1 shown in FIG. 1 is formed from flip-flop circuits 2–9. The flip-flop circuits 2–9 are connected to a VPP power supply having a higher potential than an internal power supply VDD, and to an GND power supply. The VPP power supply is generated by stepping up the internal power supply VDD by a step-up circuit 15. Also, reference numeral 11 denotes a column decoder. Reference numeral 12 denotes a delay/inversion circuit that delays the write enable signal XWE by a time D1, and inverts the same. Reference numerals 13 and 14 denote level shifter circuits, which convert a VDD signal into a VPP signal, and a VPP signal to a VDD signal, respectively.

An operation of the above will be described. As shown in FIG. 3, first, a program mode is set at a rising of a write enable signal XWE to the H level while an address latch enable signal ALE is at the L level. Next, a row address is set (to select a word line) at a rising of the write enable signal XWE to the H level while the address latch enable signal ALE is at the H level. Next, while the ALE signal is at the L level, program data are successively taken in at each falling to the L level and each rising to the H level of the XWE signal for one page, in other words, from address 0 to address 511. Then, actual programming operations are executed on the memory transistors. The column address signals A0–A8 are generated by the counter circuit 1 using an input of the XWE signal as shown in FIG. 1, and counted in synchronism with fallings of the XWE signal. Outputs of the counter circuit 1 in FIG. 1 are calculated such that, as shown in FIG. 2, at the first falling of the XWE signal to the L level, all of the signals A0–A8 are at the L level to select column address 0; at the first rising, only the signal A0 is at the H level to select column address 1; and at the $256^{th}$ rising, all of the signals A0–A8 are at the H level to select column address 511.

Here, the delay amount D0 (only a delay after the last address is shown to facilitate understanding, but in effect, delays occur at all of the addresses) in the output of the counter circuit is smaller as indicated in FIG. 2 compared to the conventional example, because the counter circuit is connected to the VPP power supply having a higher potential than the internal power supply VDD and to the GND power supply to drive the counter circuit, and therefore the capability of the transistors composing the counter circuit is improved. As a result, the frequency of the XWE signal can be increased, and the time for taking program data can be further shortened.

Also, in the embodiment example, the VPP power supply is described as a step-up voltage of the internal power supply VDD. However, an external power supply voltage higher than the internal power supply voltage can provide similar effects.

As described above, in accordance with the present invention, since program data are taken in synchronism with the risings and fallings of an external clock, the time for taking program data can be shortened by half.

Also, because the counter circuit that counts an external clock is driven by using a power supply voltage that is higher than an internal power supply voltage, the operation delay of the counter circuit is reduced, and the frequency of the external clock can be increased, such that the time for taking program data can be further shortened.

The effects described above would become more beneficial in future attempts to shorten actual programming operation time, and to shorten overall programming time that combines the time of taking program data and actual programming operation time.

The entire disclosure of Japanese patent application number 2001-244855 filed Aug. 10, 2001 is hereby incorporated by reference.

What is claimed is:

1. A non-volatile semiconductor integrated circuit comprising:

a counter circuit that generates column addresses in synchronism with an external clock, and conducts a page programming sequence in word line units; and a memory module that receives program data according to the column addresses in synchronism with fallings and risings of the external clock;

wherein the counter circuit is driven based on a power supply voltage that is higher than an internal power supply voltage.

2. A non-volatile semiconductor integrated circuit according to claim 1, wherein the power supply voltage that is higher than the internal power supply voltage is provided by a step-up power supply that is formed based on the internal power supply voltage or an external power supply voltage.

3. A non-volatile semiconductor integrated circuit according to claim 1, wherein the power supply voltage that is higher than the internal power supply voltage is supplied by an external power supply voltage.

4. A method of conducting a page programming sequence in word line units with a non-volatile semiconductor integrated circuit comprising:

generating column address with a counter circuit in synchronism with an external clock;

inputting program data to a memory module according to the column addresses in synchronism with fallings and risings of the external clock; and driving the counter circuit based on a power supply voltage that is higher than an internal power supply voltage.

5. The method of claim 4, further comprising:

providing the power supply voltage by a step-up power supply that is formed based on the internal power supply voltage.

6. The method of claim 4, further comprising:

providing the power supply voltage by a step-up power supply that is formed based on an external power supply voltage.

7. The method of claim 4, further comprising:

supplying the power supply voltage by an external power supply voltage.

* * * * *